(12) United States Patent
Lau et al.

(10) Patent No.: US 6,317,852 B1
(45) Date of Patent: Nov. 13, 2001

(54) METHOD TO TEST AUTO-REFRESH AND SELF REFRESH CIRCUITRY

(75) Inventors: Hon-Shing Lau; Yaw T. Oh, both of Hsinchu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/177,341

(22) Filed: Oct. 23, 1998

(51) Int. Cl.$^7$ .............................. G11C 29/00; G11C 7/00
(52) U.S. Cl. ............................................ 714/720; 365/201
(58) Field of Search .................................. 714/719, 718, 714/720; 365/201, 222

(56) References Cited

U.S. PATENT DOCUMENTS

| | | | | |
|---|---|---|---|---|
| 4,672,583 | * | 6/1987 | Nakaizumi | 365/222 |
| 5,321,661 | * | 6/1994 | Iwakira et al. | 365/222 |
| 5,335,202 | * | 8/1994 | Manning et al. | 365/222 |
| 5,349,562 | * | 9/1994 | Tanizaki | 365/222 |
| 5,446,695 | * | 8/1995 | Douse et al. | 365/222 |
| 5,450,364 | * | 9/1995 | Stephens, Jr. et al. | 365/222 |
| 5,625,597 | * | 4/1997 | Hirose | 365/201 |
| 5,684,748 | * | 11/1997 | Jang | 365/201 |
| 5,703,823 | * | 12/1997 | Douse et al. | 365/222 |
| 5,790,468 | * | 8/1998 | Oh | 365/222 |
| 5,982,682 | * | 11/1999 | Nevill et al. | 714/719 |
| 5,991,904 | * | 11/1999 | Duesman | 714/719 |
| 5,995,424 | * | 11/1999 | Lawrence et al. | 365/201 |
| 6,094,734 | * | 7/2000 | Beffa et al. | 714/718 |

FOREIGN PATENT DOCUMENTS

591811-A2  *  4/1994  (EP).

* cited by examiner

*Primary Examiner*—Albert Decady
*Assistant Examiner*—Joseph Torres
(74) *Attorney, Agent, or Firm*—George O. Saile; Stephen B. Ackerman

(57) ABSTRACT

This invention describes a method to test both auto-refresh and self refresh of an SDRAM. The method writes a logical zero in to a single cell on each word line using a write with auto-precharge and increments an internal counter with either auto-refresh or self refresh to select the row address. The test is performed using existing circuitry on the SDRAM, and when testing self refresh, the refresh cycle is exited shortly after a cell on a row has been written into so as to not run the entire refresh cycle and save test time. A test signature is formed by the logical zeros written into one cell along each word line. Comparing this signature with the signature that should exist provides an easy way to determine if there is a test error and where the error occurred.

17 Claims, 3 Drawing Sheets

METHOD TO TEST AUTO-REFRESH AND SELF REFRESH CIRCUITRY

BACKGROUND OF THE INVENTION

1. Field of Invention

This invention applies to testing of semiconductor memories and in particular testing auto-refresh and self refresh circuitry for Synchronous DRAM's.

2. Description of Related Art

During an auto-refresh for a SDRAM (Synchronous DRAM) an address from the internal counter is decoded to turn on a word line. All cells along the word line are refreshed After the refreshing is complete the word line is automatically turned off and the internal counter is incremented by one. The same process happens in a self refresh operation, except the self refresh operation is executed every sixteen microseconds. It is very difficult to test auto-refresh or self refresh for a SDRAM because the refresh operations are self timed. During refresh the word line address is also difficult to read to know which word line is being refreshed.

Involved in refreshing a SDRAM are the internal counter, auto-refresh control logic and self refresh control logic. If the counter is incremented by one after either an auto-refresh or a self refresh, then it has been held that the refresh circuitry worked properly.

In U.S. Pat. No. 4,672,583 (Nakaizumi) a DRAM (dynamic random access memory) is equipped with a test circuit for testing the internal refresh circuitry. An internal address counter is used to supply an address to both the row and column address decoders such that one memory cell is designated along a diagonal in the memory cell array. Each designated memory cell is written into and then read to insure the correct data was written. Referring to U.S. Pat. No. 5,321,661 (Iwakiri et al.), test circuitry is included on a DRAM to allow testing of the on chip refresh circuitry. In U.S. Pat. No. 5,625,597 (Hirose) test circuitry is included on a DRAM to test the refresh counter and to the counter cycle at time of refresh.

It is the purpose of this invention to present a method to test auto-refresh circuitry and a similar method to test self refresh circuitry in an easy and concise way for an SDRAM. It is further a purpose of this invention to be able to accurately determine on which word line a refresh failure occurred.

SUMMARY OF THE INVENTION

"In the present invention a method is described for testing" the auto-refresh and the self refresh of an SDRAM. The two methods are a slight variation on one another caused by the differences between the two operations in which the self refresh is self timed to occur every few microseconds. In the method for self refresh, it is not necessary to wait until the self refresh cycle is complete. Exit of the self refresh command can be done after a memory row has been refreshed in the test mode. No additional circuitry is needed to perform either the auto-refresh or the self refresh test, and the row and column address do not need to be in any particular relationship with one another.

In the method for testing the auto-refresh mode, the SDRAM is initialized with a logical "1" written into every memory cell. Then an MRS (mode register set) command is issued and the chip is set into a test mode. A row active command is issued to activate a word line by using the address from an internal counter. A logical "0" is written to a column of the memory array using write with auto-precharge command where the logical "0" is written into a cell corresponding to the column along a word line addressed by the internal counter. The write with auto-precharge command writes column data to the cells along a word line and then turns off the word line. Only the single cell corresponding to the column address is written with a logical "0". All other cells along the word line contain a logical "1" written during initialization of the chip.

When testing the auto-refresh mode, an auto-refresh command is issued which increments the internal counter used to address the word lines. If the last word line has not been tested, a column containing a logical "0" is written into a corresponding cell along a word line being addressed by the internal counter. The internal counter is incremented until the last word line is tested. If the last word line has been tested, an MRS command is issued and the test mode is turned off. Similarly, when testing self refresh, a self refresh command is issued to increment the internal counter to address the word lines. If the last word line has not been tested, a column address is used to write a logical "0" into a cell. The internal counter is incremented by self refresh, and the self refresh mode is exited. This is repeated until a logical "0" has been written into a cell in every word line. By exiting self refresh after the internal counter is incremented saves test time by not waiting for a whole self refresh cycle to complete.

Next each word line is turned on in sequence and the cells along each word line are read using read with auto-precharge which reads the word and then turns off the word line. A test signature is formed by the logical zeros written into one cell along each word line. Comparing this signature with the signature that should exist provides an easy way to determine if there is a test error and where the error occurred.

Testing auto-refresh is the same process as testing self refresh except the internal counter is incremented using the auto-refresh command, and there is no step to exit auto-refresh after incrementing the internal counter. Similar to self refresh, a test signature is formed by the logical zeros written into one cell along each word line. Comparing this signature with the signature that should exist provides an easy way to determine if there is a test error and where the error occurred.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
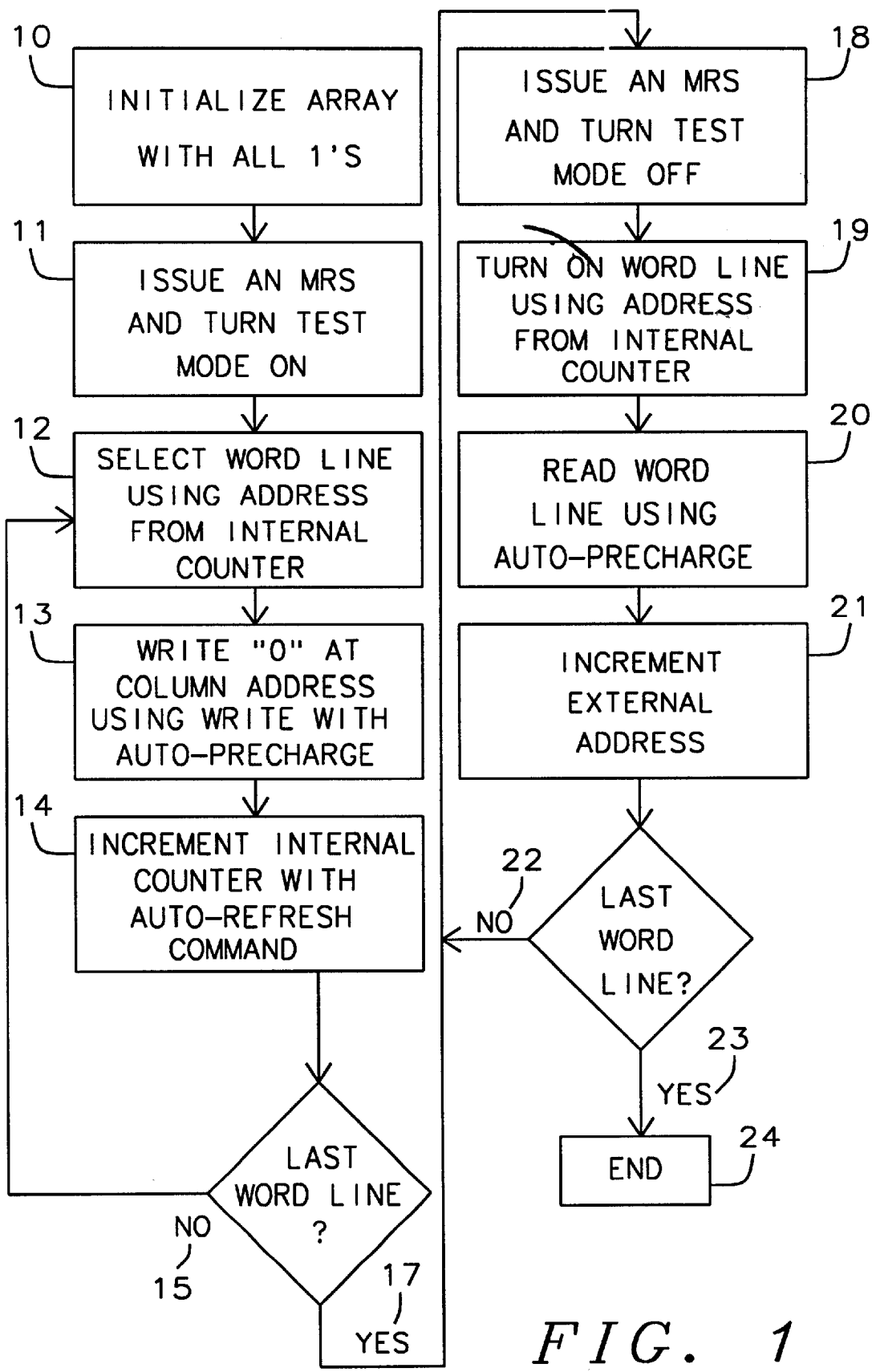
FIG. 1 is a flow diagram showing the process to test auto-refresh.

Referring to FIG. 1, a flow diagram of the method to test auto-refresh is shown. A storage array of an SDRAM is initialized 10 by writing a logical "1" into every memory cell. After the array has been initialized 10, a mode register set (MRS) command is issued to turn the test mode on 11. Then a word line is selected using an internal counter 12. A logical "0" is written at the column address using write with auto-precharge 13, and then auto-precharge turns off the word line after writing. The internal counter is incremented using the auto-refresh command 14. If testing has not been done with the last word line 15, a new word line is selected using the address from the internal counter 12. A logical "0" is written 13 into a cell on the new word line. The internal counter is again incremented by one using the auto-refresh command 14 until auto refresh has been tested with the last word line 17. This procedure writes a logical "0" into one cell on each word line to form a test signature from which failures in refresh can readily be detected. When the test results are bad, the error can be easily detected because the test signature pattern of logical zeros is disrupted, and allows the identification of the location of the error.

Continuing to refer to FIG. 1, after the last word line has been tested for auto-refresh 17, an MRS command is issued to turn off the test mode 18. A word line is then turned on using the address from the internal counter 19, and the word line is read using auto-precharge 20 after which auto-precharge turns off the word line. The internal counter is incremented using the read with auto-refresh command 21, and if the last word line has not been read 22, the next word line is turned on 19. The next word line is read using read with auto-precharge 20, and the counter is again incremented with the auto refresh command 21. This process continues until the last word line has been read 23 and the test process is ended 24.

Figure 2:
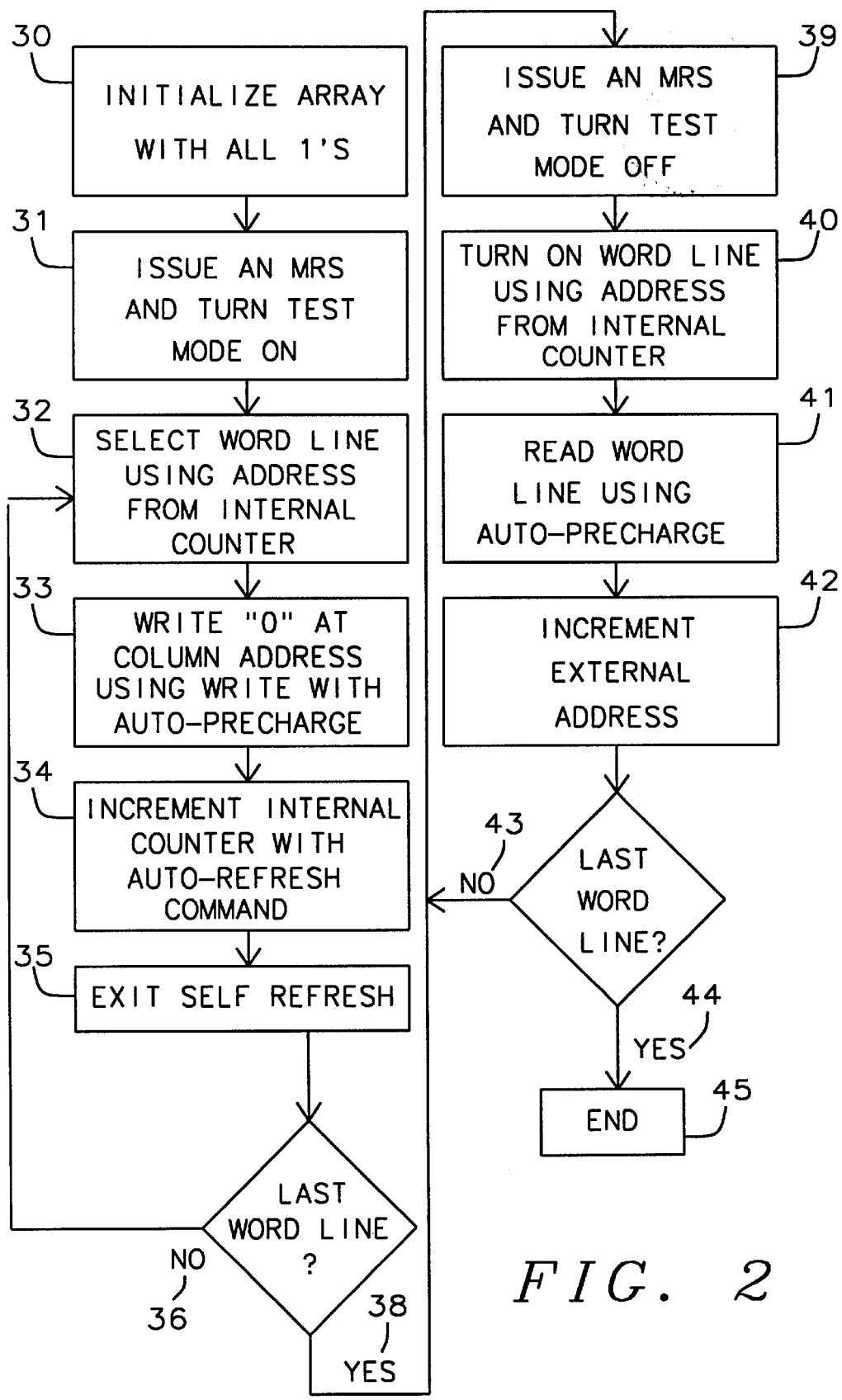
FIG. 2 is a flow diagram showing the process to test self refresh.

Referring to FIG. 2, a flow diagram of the method to test self refresh is shown. A storage array of an SDRAM is initialized 30 by writing a logical "1" into every memory cell. After the array has been initialized 30, an MRS command is issued to turn the test mode on 31. Then a word line is selected using an internal counter 32. A logical "0" is written at a column address along the word line using write with auto-precharge 33 after which auto-precharge turns off the word line. The internal counter is incremented using the self refresh command 34, and self refresh is exited 35 to save test time that would otherwise result from allowing self refresh operations to run to completion. If self refresh has not been tested with the last word line 36, a new word line is selected using the address from the internal counter 32. A logical "0" is written 33 at a column address on the new word line determined by the address of the internal counter. The internal counter is again incremented by one using the self refresh command 34, and the self refresh is exited 35 again to save test time. A new word line address is selected 32 until self refresh is tested with the last word line 38. This procedure writes a logical "0" into one cell on each word line to form a test signature from which failures in refresh can readily be detected. When the test results are bad, the error can be easily detected because the test signature pattern of logical zeros is disrupted. This allows the easy identification of the location of the error.

Continuing to refer to FIG. 2, after the last word line has been tested for self refresh, an MRS command is issued to turn off the test mode 39. A word line is then turned on using the address from the internal counter 40, and the word line is read using read with auto-precharge 41, turning off the word line after the word line is read. The internal counter is incremented using the auto-refresh command 42, and if the last word line has not been read, 43 the next word line is turned on 40. The next word line is read using auto-precharge 41, and the counter is again incremented with the auto refresh command 42. This process continues until the last word line has been read 44 and the test process is ended 45.

Figure 3:
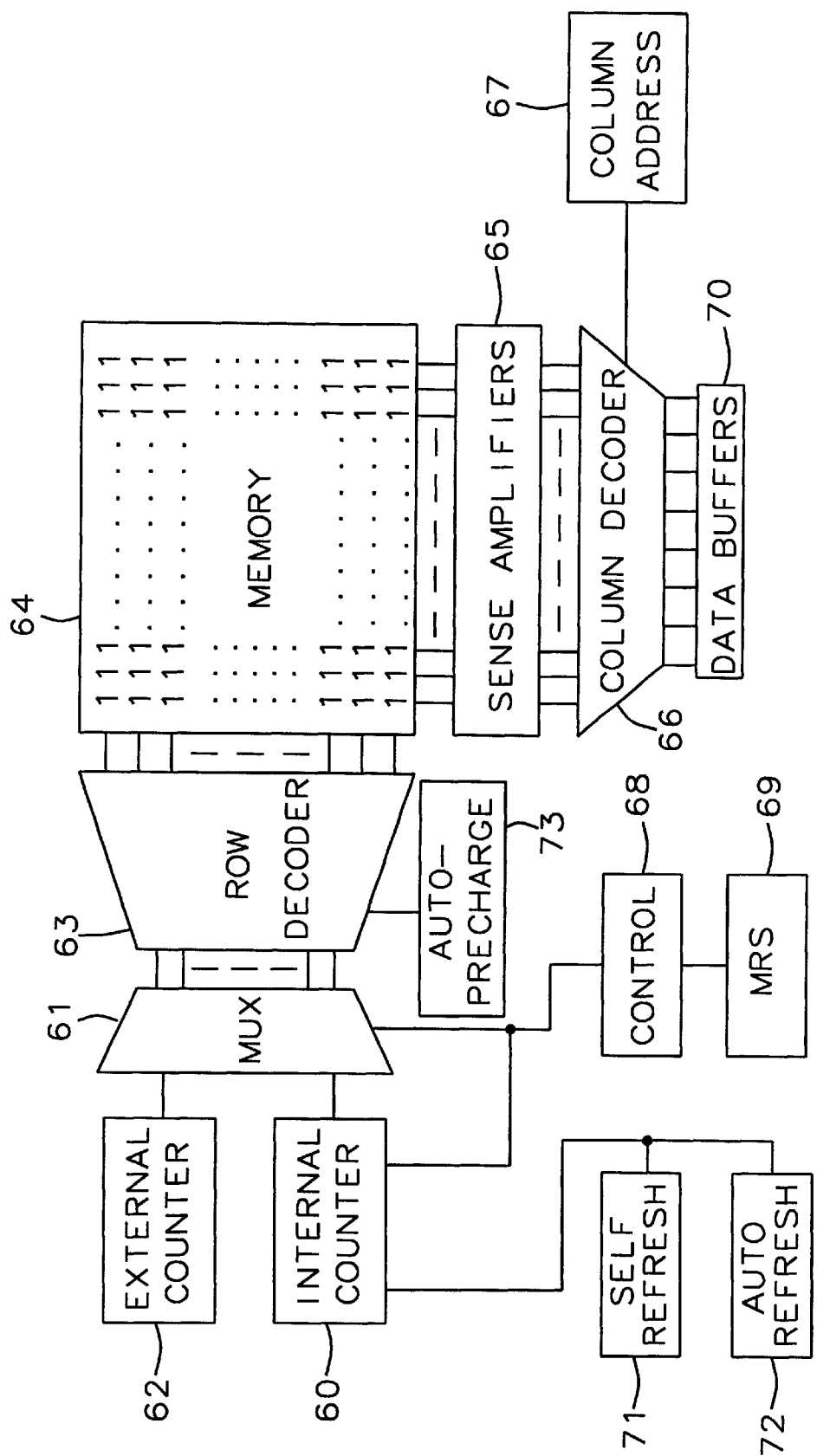
FIG. 3 is a schematic showing a simplified diagram of an SDRAM and the functions needed to perform testing of refresh.

Referring to FIG. 3, a simplified schematic of a SDRAM is shown. An internal counter 60 and an external address 62 are shown connected to a MUX (multiplexer) 61 to provide addresses to a row decoder 63. When in test mode, the MUX 61 selects the internal counter 60 by means of the MRS 69 and the control logic 68 to furnish addresses to the row decoder 63. The row decoder 63 connects to an array of memory cells 64. The array of memory cells 64 is drawn for convenience be one plane and to have an equal number of rows and columns, but the array can be arranged to have more rows than columns or more columns than rows and consist of more than one plane. Shown written into each cell of the memory array 64 is a logical "1" written at initialization. This is an arbitrary choice and a logical "0" could have been written as the initial data. The write command and precharge command can be used to replace write with auto-precharge. Also the read command and precharge command can be used to replace read with auto-precharge.

Continuing to refer to FIG. 3, the memory array 64 is connected to a set of sense amplifiers 65 which is in turn connected to data buffers 70 through a column decoder 66. The column address 67 is connected to the column decoder 67 which determines which column is to be written with data that is a negate of the initialization data. Column data is written into a column address 67 on a word line having a row address from the internal counter 60 using a write with auto-precharge command 73. The write with auto pre-charge command 73 writes column data onto the word line at the row address provided by the internal counter 60 and then turns off the word line. After data has been written into a word line, read with auto-precharge 73 is used to read data from the word line and then turn the word line off.

Continuing to refer to FIG. 3, connected to the internal counter 60 is self refresh 71 and auto-refresh 72. Self refresh 71 is used to increment the internal counter 60 during self refresh testing to provide a word line address that is to be written by column data using write with auto-precharge 73. After incrementing the internal counter 60, self refresh is exited to save test time which would otherwise be spent cycling through self refresh. Similarly, auto-refresh 72 is used to increment the internal counter 60 during auto-refresh testing. After column data is written into a new word line using auto precharge 73, the internal counter 60 is again incremented using auto-refresh. Auto refresh 72 is used repeatedly until all the word lines of the memory array 64 have been written into by write with auto-precharge 73 for testing auto refresh, and self refresh 71 is used repeatedly until all the word lines of the memory array 64 have been written into by auto-precharge 73 for the testing of self refresh.

Continuing to refer to FIG. 3, written into the cells of the memory array 62 is a logical "1" which occurred during initialization. A test signature is formed by writing a logical "0" into one cell in each word line using an MRS test mode 69, auto-precharge 73, and auto-refresh 72 or self refresh 71 to increment the internal counter 60. When there is a test failure, the test signature is disrupted and the location of the error can easily be determined.

While the invention has been particularly shown and described with reference to preferred embodiments thereof, it will be understood by those skilled in the art that various changes in form and details may be made without departing from the spirit and scope of the invention.

What is claimed is:

1. A method to test auto-refresh for an SDRAM, comprising:

a) initializing an SDRAM to have a logical "1" in all memory locations, b) turning on test mode, c) writing a logical "0" into one cell on a word line using write with auto-precharge or write and precharge, d) incrementing from word line to word line using an internal counter and an auto-refresh command until a logical "0" has been written into one cell on each word line, e) turning off the test mode, f) reading each word line using read with auto-precharge or read and precharge.

2. The method of claim 1, wherein initializing the SDRAM to have a logical "0" in all memory locations and writing a logical "1" into one cell on each word line using said auto-refresh is done.

3. The method of claim 1, wherein reading all word lines produces a test signature of a pattern of logical "0's" allowing an exact determination of an internal address having a refresh error.

4. The method of claim 1, wherein turning on said test mode is preceded by issuing a mode register set (MRS) command.

5. The method of claim 1, wherein turning off said test mode is preceded by issuing a mode register set (MRS) command.

6. The method to test self refresh for an SDRAM, comprising:

a) initializing an SDRAM to have a logical "1" in all memory locations, b) turning on test mode, c) writing a logical "0" into one cell on all word lines using write with auto-precharge or write and precharge, d) incrementing from word line to word line using a self refresh command to increment an internal counter until a logical "0" has been written into one cell on each word line, e) turning off self refresh each time after the internal counter has been incremented by said self refresh command, f) turning off the test mode, g) reading each word line using read with auto-precharge or read and precharge.

7. The method of claim 6, wherein self refresh is turned off each time after the internal counter has been incremented to save test time.

8. The method of claim 6, wherein initializing the SDRAM to have a logical "0" in all memory locations and writing a logical "1" into one cell on each word line using said auto-refresh is done.

9. The method of claim 6, wherein reading all word lines produces a test signature of a pattern of logical "0's" allowing an exact determination of an internal address having a refresh error.

10. The method of claim 6, wherein turning on said test mode is preceded by issuing a mode register set (MRS) command.

11. The method of claim 6, wherein turning off said test mode is preceded by issuing a mode register set (MRS) command.

12. A method for auto-refresh testing, comprising:

a) initializing an SDRAM by writing a logical "1" into every memory cell, b) turning on a test mode by issuing a MRS (Mode Register Set), c) turning on a word line using an address from an internal counter, d) writing a logical "0" at column address using write with auto-precharge or write and precharge, e) incrementing internal counter with auto-refresh, f) going to step (c) if last word line not tested, else issuing an MRS and turning test mode off, g) turning word line on using address from internal counter, h) reading word line using read with auto-precharge or read and precharge, i) incrementing internal counter with auto-refresh command, j) going to step (g) if last word line not read, else ending test method.

13. The method of claim 12, wherein writing said logical "0" into one cell at a column address forms a test signature that determines any test failure and where it occurred.

14. The method of claim 12, wherein reading each word line produces a pattern of logical "0's" when compared to an expected good result provides and exact determination an internal address having a refresh error.

15. A method for self refresh testing, comprising:

a) initializing an SDRAM by writing a logical "1" into every memory cell, b) turning on a test mode by issuing a MRS (Mode Register Set), c) turning on a word line using an address from an internal counter, d) writing a logical "0" at column address using write with auto-precharge or write and precharge, e) incrementing internal counter with self refresh, f) exiting self refresh, g) going to step (c) if last word line not tested, else issuing an MRS and turning test mode off, h) turning word line on using address from internal counter, i) reading word line using read with auto-precharge or read and precharge, j) incrementing internal counter with auto-refresh command, k) going to step (h) if last word line not read, else ending test method.

16. The method of claim 15, wherein writing said logical "0" into one cell at a column address forms a test signature that determines any test failure and where it occurred.

17. The method of claim 15, wherein reading each word line produces a pattern of logical "0's" when compared to an expected good result provides an exact determination an internal address having a refresh error.

* * * * *